(12) United States Patent
Hsu

(10) Patent No.: US 7,182,619 B2
(45) Date of Patent: Feb. 27, 2007

(54) ELECTRICAL SOCKET

(75) Inventor: Hsiu-Yuan Hsu, Tu-cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 11/338,137

(22) Filed: Jan. 23, 2006

(65) Prior Publication Data

US 2006/0166542 A1    Jul. 27, 2006

(30) Foreign Application Priority Data

Jan. 21, 2005    (TW) .............................. 94201142 U

(51) Int. Cl.
*H01R 13/62* (2006.01)

(52) U.S. Cl. .................... 439/331; 439/73; 439/342

(58) Field of Classification Search ................ 439/342, 439/330–331, 70–71, 266, 73
See application file for complete search history.

(56) References Cited

U.S. PATENT DOCUMENTS 4,515,425 A * 5/1985 Nakano ........................ 439/73
4,560,217 A * 12/1985 Siano ........................... 439/68
4,824,392 A * 4/1989 Billman et al. ............. 439/331
5,009,608 A * 4/1991 Shipe ........................... 439/331
5,120,238 A * 6/1992 Marks et al. ................ 439/331
6,213,806 B1 * 4/2001 Choy ........................... 439/331
6,547,580 B1 * 4/2003 Leavitt et al. ............... 439/266
6,716,049 B1 * 4/2004 Gattuso et al. ............. 439/331

* cited by examiner

*Primary Examiner*—Michael C. Zarroli
(74) *Attorney, Agent, or Firm*—Wei Te Chung

(57) ABSTRACT

An IC socket includes a socket body (10), a plurality of contacts received in the socket body, a first press cover (12) pivotally mounted at one end of the socket body, and a second press cover (14) pivotally mounted at an opposite free end of the first press cover. The second press cover includes a pair of legs (148) extending from two sides of the end mounted onto the first press cover. A lever (20) is defined at corresponding end of the socket body, and two ends of the lever extend out of two sides of the socket body. Said extending out ends are corresponding to the legs, and each end defines a rigid sleeve (60) therearound. When the first press cover and the second press cover are rotated to a horizontal close position, the legs will engage with the sleeve rather than engage with the lever directly.

8 Claims, 7 Drawing Sheets

(The Related Art)

(The Related Art)

ELECTRICAL SOCKET

Cross-Reference to related application Ser. No. 11/324,618, filed Jan. 3, 2006.

BACKGROUND OF THE INVENTION

Field of the Invention

The present invention relates to electrical connectors, and more particularly to electrical sockets for holding IC packages.

A conventional electric socket 1' for testing an IC package is shown in FIG. 6 and FIG. 7. The electrical socket 1' includes a socket body 10', a plurality of contacts (not shown) received in the socket body 10', a first press cover 12' pivotally mounted at one end of the socket body, and a second press cover 14' pivotally mounted at an opposite free end of the first press cover 12'.

The first press cover 12' is pivotally mounted to the socket body via a first pivot 30' at one end thereof, and a second pivot 40' extending through an opposite end of the first cover 12' for pivotally mounting the second press cover 14'. The second press cover 14' includes a pair of legs 148 extending from two sides of the end mounted onto the first press cover 12'. A lever 20' extends through the socket body 10, and two ends of the lever 20' extend out of two sides of the socket body. The extending two ends of the lever 20' engage with said legs 148 of the second press cover 14', therefore fixing the first press cover 12' onto the socket body 10'. Furthermore, a locking member 141' is defined at another end of the second press cover 14' for locking the second press cover onto the socket body.

In use, the first press cover 12' is first rotated to a vertical open position, and an IC package is placed in a receiving room of the socket body 10'. Then the first press cover 12' and the second press cover 14' are rotated to a horizontal close position, and the second press cover 14' fitly lies on the first press cover 12'. At this time, the legs 148' of the second press cover 14' engage with the extending out two ends of the lever 20, and the first press cover 12' is therefore firmly mounted onto the socket body 10'. When the locking member 141' is locked onto the socket body 10', the second press cover 14' is also fastened. Therefore, the IC package is steadily clasped in the receiving room of the socket body 10', and high temperature testing can be performed.

After the testing, the locking member 141' is released, and the second press cover 14' is rotated to a vertical position. With rotation of the second press cover 14', the legs 148' disengage with the extending out ends of the lever 20' gradually, and the first press cover 12' is also released. Then the IC package is dismounted from the receiving room of the socket body 10', and another IC package can be placed into the receiving room for testing.

Such testing may be repeated many times for testing different electrical sockets, and the legs 148' will engage and disengage with the extending out ends of the lever 20' many times. One problem of this electrical socket is that the extending out ends of the lever 20' are readily damaged or abraded for many times of engagement and disengagement between the legs 148' and said ends of the lever 20'.

Therefore, it is desired to provide a new electrical socket which overcomes the above-mentioned disadvantage.

Accordingly, an object of the present invention is to provide an electrical socket that can protect the lever from being friction damaged, therefore reducing maintaining cost of the electrical socket.

To achieve the above-mentioned object, the electrical socket includes a socket body, a plurality of contacts received in the socket body, a first press cover pivotally mounted at one end of the socket body, and a second press cover pivotally mounted at an opposite free end of the first press cover. The second press cover includes a pair of legs extending from two sides of the end mounted onto the first press cover. A lever is defined at corresponding end of the socket body, and two ends of the lever extend out of two sides of the socket body. Said extending out ends are corresponding to the legs, and each end defines a rigid sleeve therearound. When the first press cover and the second press cover are rotated to a horizontal close position, the legs will engage with the rigid sleeve rather than engage with the lever directly. Therefore, the lever is protected, and the sleeve is easy to be replaced even if it is friction damaged.

DETAILED DESCRIPTION OF THE PREFERRED EMBODIMENT OF THE INVENTION

Reference will now be made to the drawings to describe the present invention in detail.

Figure 1:
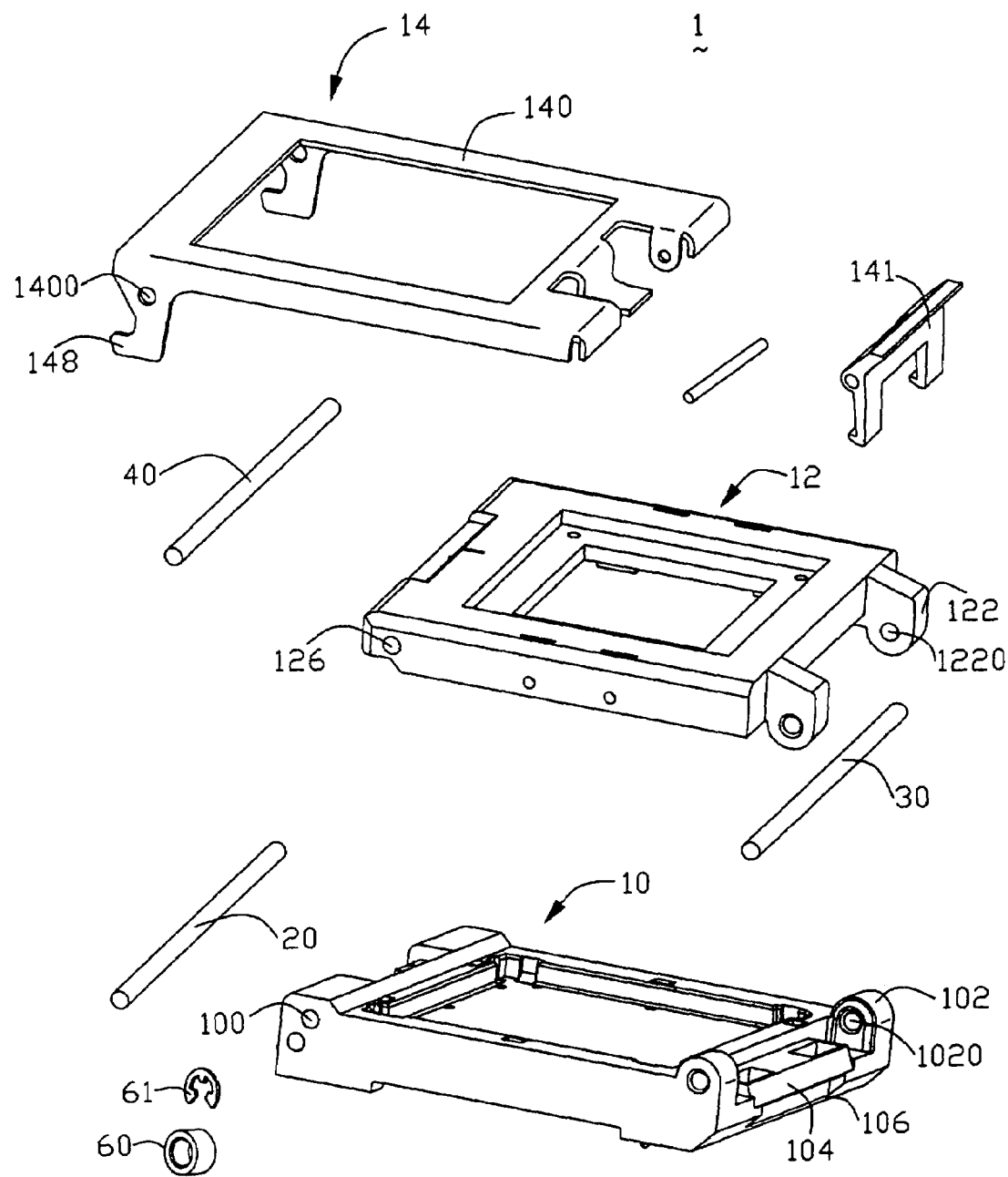
FIG. 1 is an exploded, isometric view of an electrical socket according to a preferred embodiment of the present invention.
Figure 2:
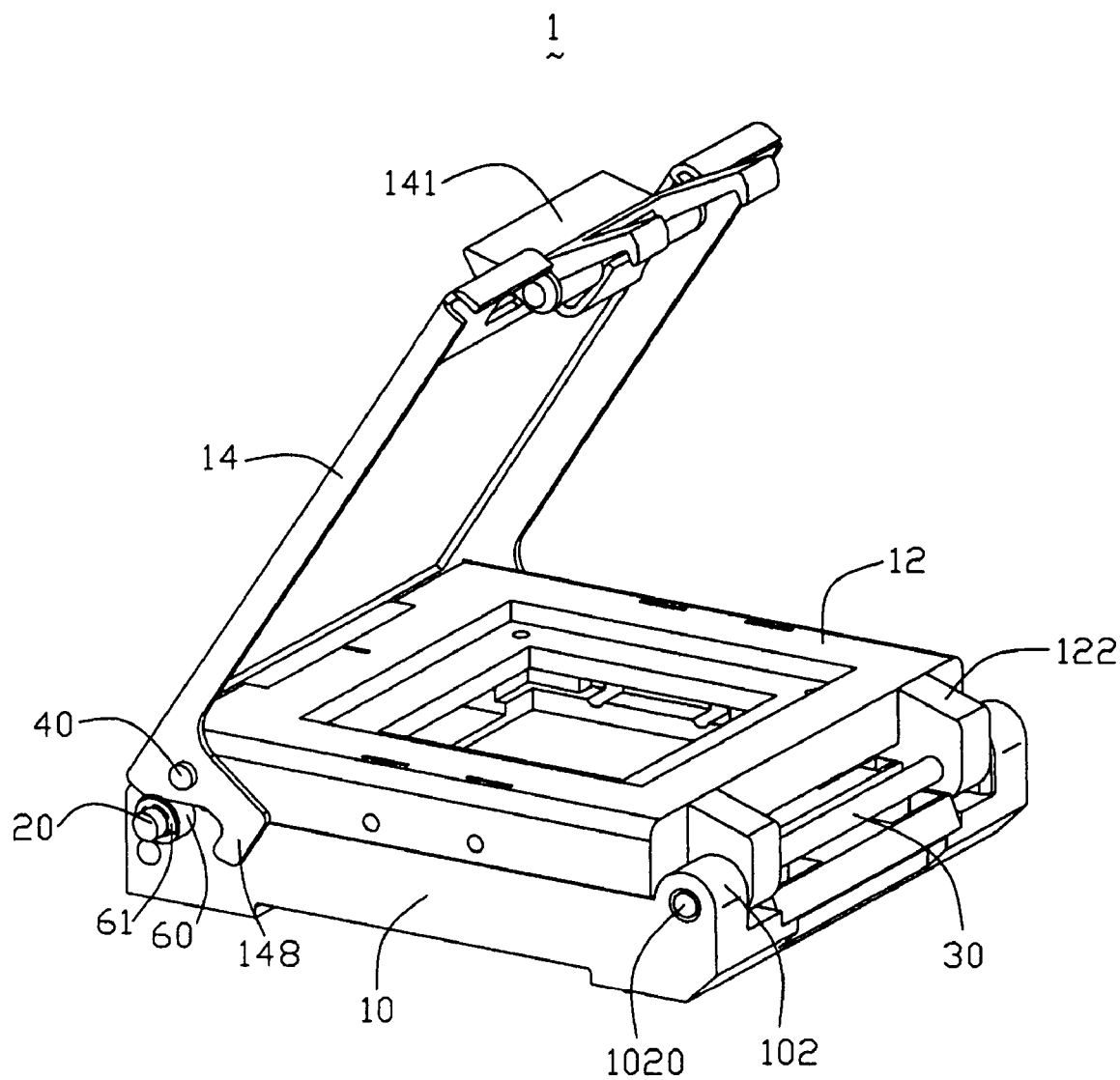
FIG. 2 is an assembled, isometric view of the electrical socket of FIG. 1, showing the first press cover at a close position and the second press cover at an open position.
Figure 3:
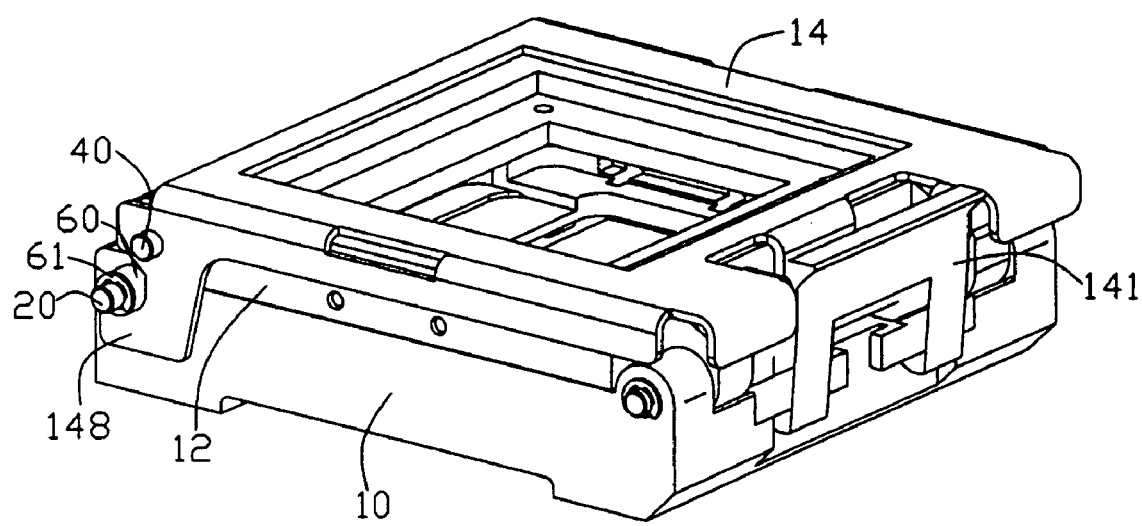
FIG. 3 is an assembled, isometric view of the electrical socket of FIG. 1, showing the IC socket at a closed position.
Figure 4:
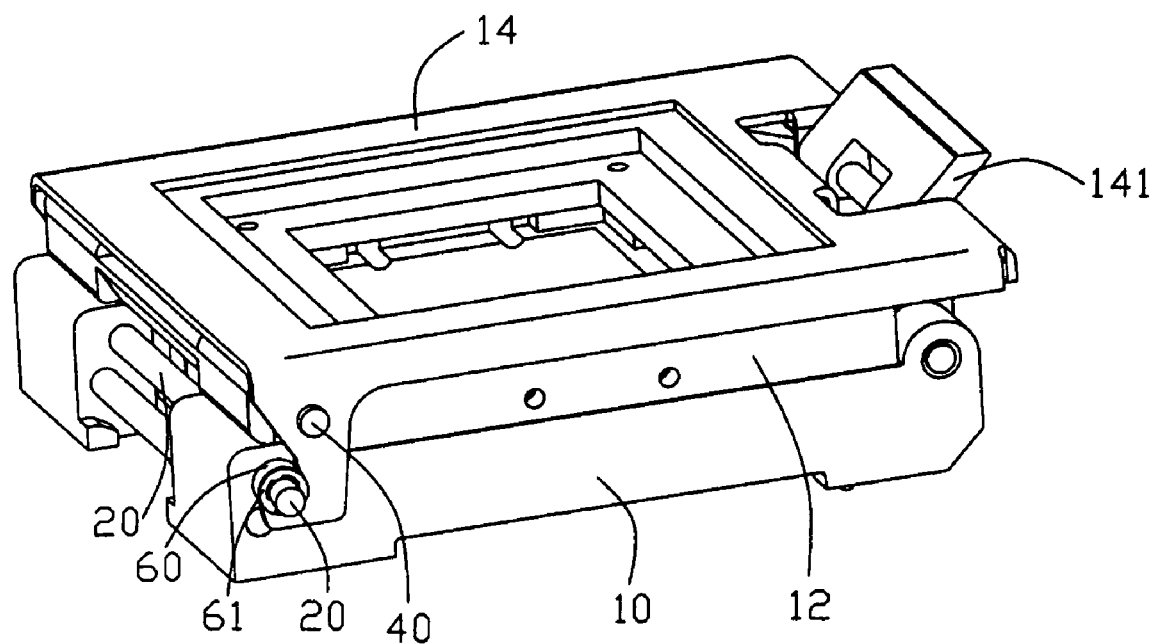
FIG. 4 is an isometric view of the electrical socket of FIG. 3, but viewed from another aspect thereof.
Figure 5:
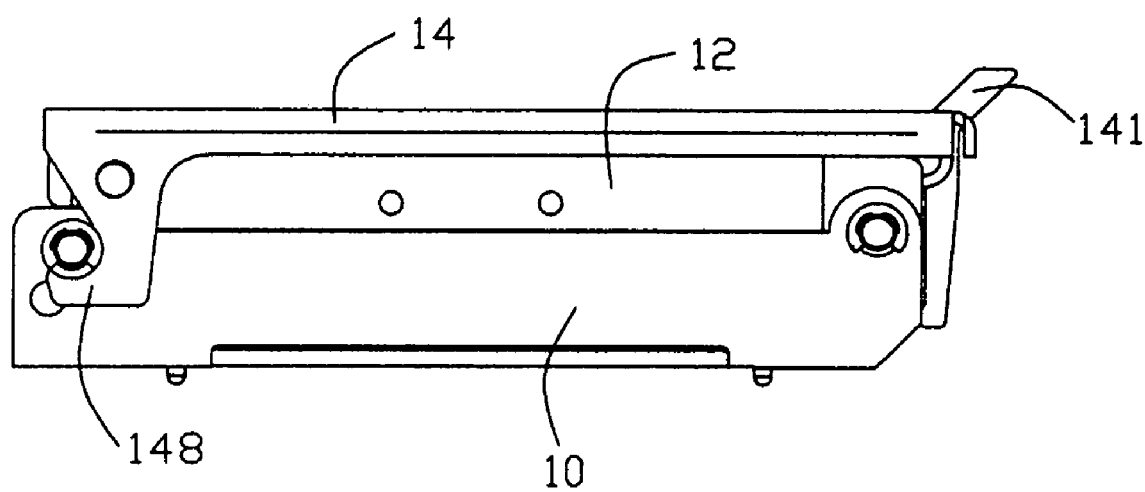
FIG. 5 is a side, plan view of the electrical socket of FIG. 4.
Figure 6:
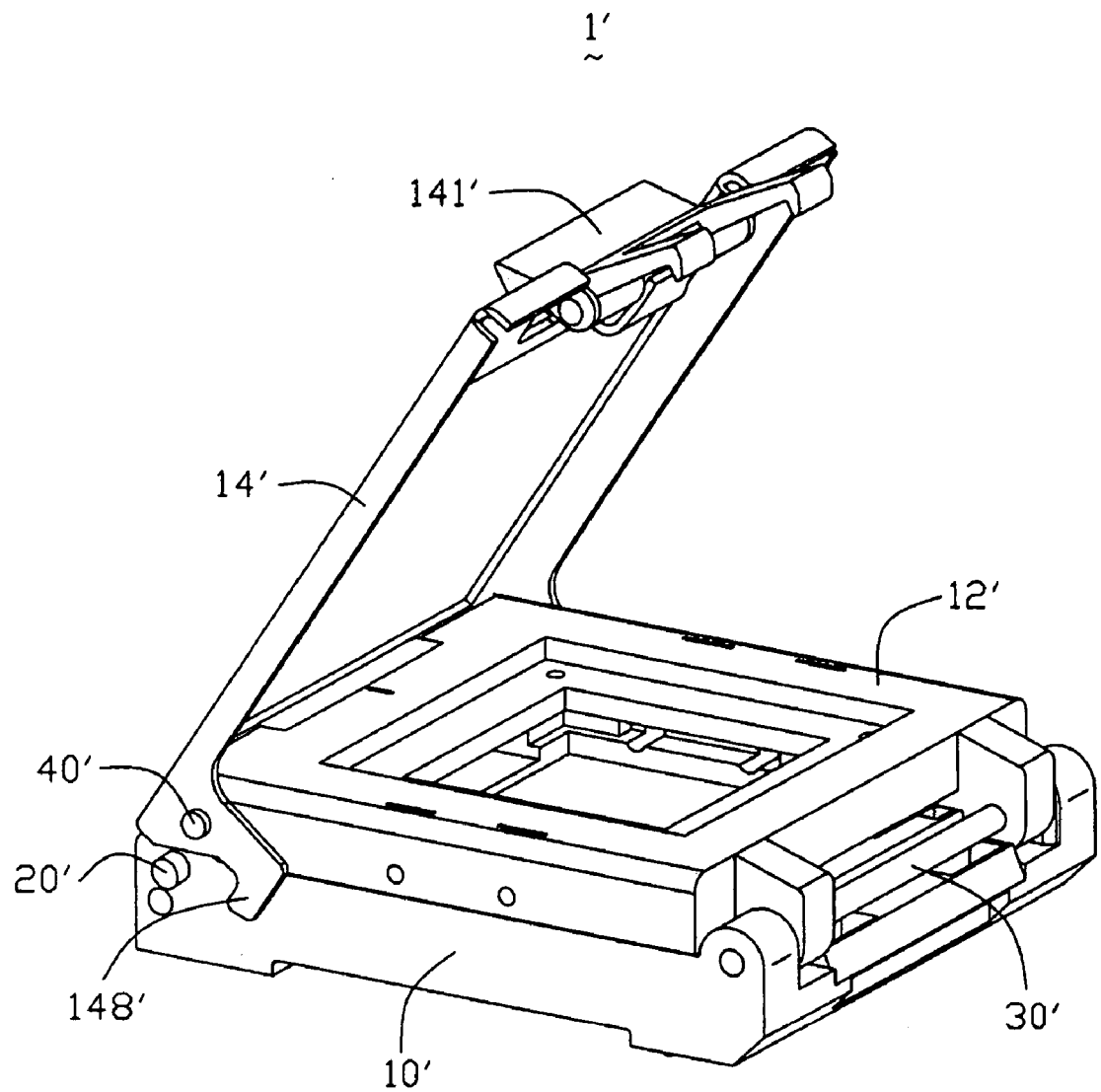
FIG. 6 is an isometric view of a conventional electrical socket, showing the first press cover at a close position and the second press cover at an open position.
Figure 7:
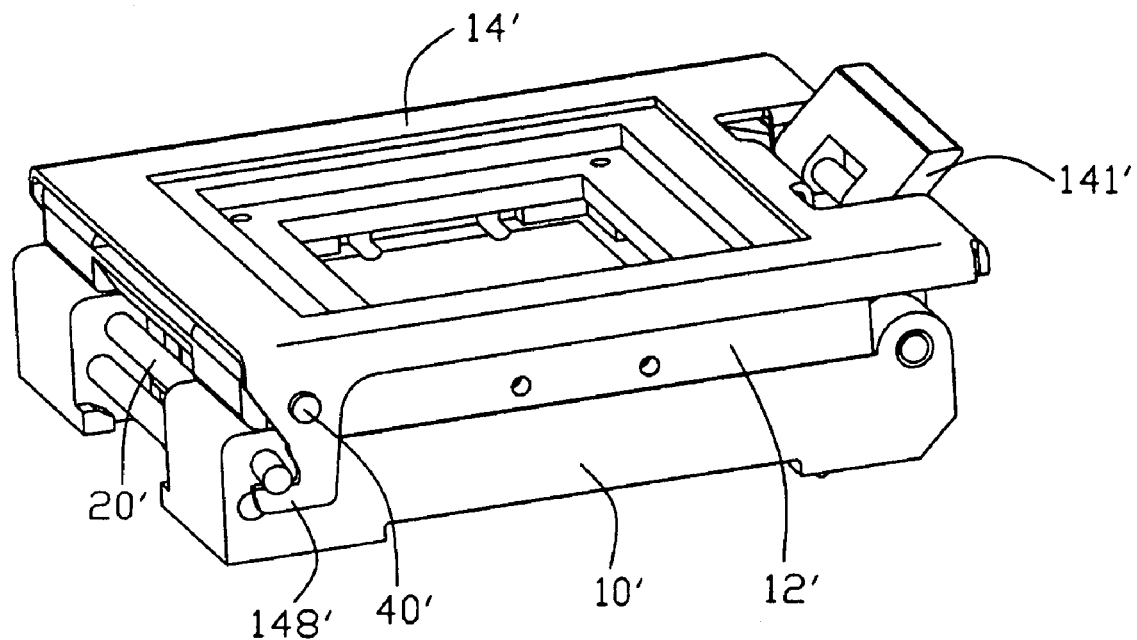
FIG. 7 is an isometric view of the electrical socket of FIG. 6, but showing the IC socket at a closed position.

Referring to FIGS. 1–5, the electrical socket 1 includes a socket body 10, a plurality of contacts (not shown) received in the socket body 10, a first press cover 12 pivotally mounted at one end of the socket body, and a second press cover 14 pivotally mounted at an opposite free end of the first press cover 12.

The socket body 10 is substantially of a rectangular configuration, and it defines a receiving room for receiving an IC package therein. A pair of spaced ribs 102 is arranged on one end of the socket body 10, with a longitudinally extending hole 1020 formed in each of the ribs 102. A protrusion 104 is formed between said two ribs 102, and a latch portion 106 is defined at middle of the protrusion 104. In the preferred embodiment, the latch portion 106 is a recess under the protrusion 104. The socket body 10 defines a pair of lever holes 100 at the opposite ends thereof for receiving a lever 20 extending therethrough, and each end of the lever 20 extends beyond corresponding sides of the socket body 10. Each extending out end defines a rigid sleeve 60 therearound and a blocking ring 61 abuts against the rigid sleeve 60 for preventing the sleeve 60 falling off from the lever 20. Said rigid sleeve 60 is preferably made from rigid metal or rigid plastic.

The first press cover 12 has a substantially rectangular configuration with a center window thereof. The first press cover 12 defines a pair of ears 122 corresponding to the ribs 102 of the socket body 10, and each ear 122 defines a first pivot hole 1220. A first pivot 30 extends through the pivot holes 1220 and corresponding extending holes 1020 of the ribs 102, and the first press cover 12 is therefore pivotally mounted to the socket body 10. A pair of second pivot holes 126 is defined at the opposite free end of the first press cover 12.

The second press cover 14 includes a rectangular frame 140 with downwardly extending side walls. A pair of third pivot holes 1400 is defined at one end of the side walls of the frame, and a locking member 141 is pivotally attached to the opposite end of the frame 140. A pair of legs 148 extends downwardly from said ends having pivot holes 1400, for engaging with the extending out ends of the lever 20. A second pivot 40 extends through the third pivot holes 1400 and the second pivot holes 126, and the second press cover 14 is therefore pivotally mounted to the first press cover 12.

In use, the first press cover 12 is first rotated to a vertical open position, and an IC package is placed in a receiving room of the socket body 10. Then the first press cover 12 and the second press cover 14 are rotated to a horizontal close position, and the second press cover 14 fitly lies on the first press cover 12. At this time, the legs 148 of the second press cover 14 engage with the rigid sleeve 60 around the extending out two ends of the lever 20, and the first press cover 12 is therefore firmly mounted onto the socket body 10. When the locking member 141 is locked onto latch portion 106 of the socket body 10, the second press cover 14 is also fastened. Therefore, the IC package is steadily clasped in the receiving room of the socket body 10, and high temperature testing can be performed.

After the testing, the locking member 141 is released from the latch portion 106, and the second press cover 14 is rotated to a vertical position. With rotation of the second press cover 14, the legs 148 disengage with the rigid sleeve 60 of the extending out ends of the lever 20 gradually, and the first press cover 12 is also released. Then the IC package is dismounted from the receiving room of the socket body 10, and another IC package can be placed into the receiving room for testing.

Because two ends of the lever 20 corresponding to the legs 148 are protected by the rigid sleeve 60 therearound, the lever 20 will not be friction damaged during said engagement and disengagement. Even if the rigid sleeve 60 is damaged, it is easy to be dismounted and replaced. Therefore, maintaining cost of the IC socket is reduced.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for interconnecting an IC package and a circuit substrate, the electrical connector comprising:
    a socket body adapted to accommodate the IC package therein, the socket including side walls extending along edges of the body, and having a latch arranged thereon;
    a plurality of contacts arranged in the socket body;
    a lever arranged to the socket body and having ends of the lever extending beyond the socket body;
    a first press cover with one end pivotally mounted at a first end of the socket body;
    a second press cover with one end attached to a free end of the first press cover, and a second end having a locking member, wherein the one end mounted to the free end of the first press cover including a leg corresponding to the ends of the lever extending beyond the socket body;
    wherein the ends of the lever extending beyond the socket body each includes a rigid sleeve therearound, and interengaged with the leg when the first press cover and second cover are rotated to a horizontal position.

2. The electrical connector as claimed in claim 1, wherein a blocking ring abuts against the sleeve for preventing the sleeve falling off from the lever.

3. The electrical connector as claimed in claim 2, wherein the latch portion is a recess.

4. The electrical connector as claimed in claim 3, wherein the first press cover is pivotally mounted to the socket body via a first pivot.

5. The electrical socket as claimed in claim 4, wherein the second press cover is pivotally mounted to the socket body via a second pivot.

6. The electrical socket as claimed in claim 5, wherein the rigid sleeve is made from rigid metal or rigid plastic.

7. The electrical socket for interconnecting an IC package and a circuit substrate, the electrical socket comprising:
    a socket body adapted to accommodate an IC package, a lever located at a first end of the socket body and extending outwardly beyond a corresponding side wall in a transverse direction, a latch portion being formed at a second end of the socket body opposite to said first end in a lengthwise direction opposite to the transverse direction;
    a plurality of contacts received in the socket body;
    a first press cover with a third end pivotally mounted at said second end of the socket body;
    a second press cover with a fourth end pivotally mounted at a fifth end of the first press cover which is opposite to the third end of said first press cover and with a sixth end being opposite to the fourth end and including a locking member adapted to be locked to the latch portion, the fourth end of said second press cover including at least one leg corresponding to the lever and curved in plane perpendicular to said transverse direction;
    wherein the lever is surrounded by a rigid sleeve and the leg is compliantly configured to engage with said rigid sleeve without interference when the locking member is latched to the latch portion.

8. The socket as claimed in claim 7, wherein a radius of said sleeve is dimensionally larger than that of a pivot formed by the second end and the third end or by the fourth end and the fifth end.

* * * * *